US012757543B2

(12) United States Patent
Kim et al.

(10) Patent No.: US 12,757,543 B2
(45) Date of Patent: Oct. 6, 2026

(54) DISPLAY DEVICE

(71) Applicant: LG Display Co., Ltd., Seoul (KR)

(72) Inventors: Byonghoo Kim, Paju-si (KR); Eunsoo Chang, Paju-si (KR); Sumin Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 457 days.

(21) Appl. No.: 18/494,525

(22) Filed: Oct. 25, 2023

(65) Prior Publication Data

US 2024/0222577 A1 Jul. 4, 2024

(30) Foreign Application Priority Data

Dec. 30, 2022 (KR) ........................ 10-2022-0190339

(51) Int. Cl.

| | |
|---|---|
| ***H10H 20/855*** | (2025.01) |
| ***G06F 3/041*** | (2006.01) |
| ***G06F 3/044*** | (2006.01) |
| ***H10H 20/819*** | (2025.01) |
| ***H10W 90/00*** | (2026.01) |

(52) U.S. Cl.

CPC ......... *H10H 20/855* (2025.01); *G06F 3/0412* (2013.01); *G06F 3/0443* (2019.05); *H10H 20/819* (2025.01); *H10W 90/00* (2026.01)

(58) Field of Classification Search

CPC .... H10K 59/40; H10K 59/122; H10K 59/879; H10K 59/12; H10K 59/875; H10K 59/873; H10H 20/855; H10H 20/819; G06F 3/0412; G06F 3/0443; G06F 2203/04111; G06F 3/0446; H10W 90/00

See application file for complete search history.

(56) References Cited

U.S. PATENT DOCUMENTS

| | | | | |
|---|---|---|---|---|
| 11,409,400 | B2 | 8/2022 | Lee et al. | |
| 2002/0113241 | A1* | 8/2002 | Kubota | H05B 33/04 257/79 |
| 2009/0268128 | A1* | 10/2009 | Yamada | G02F 1/133606 349/67 |
| 2011/0284881 | A1* | 11/2011 | Shikina | G09G 3/3233 257/E27.121 |

(Continued)

FOREIGN PATENT DOCUMENTS

| | | | |
|---|---|---|---|
| KR | 102262683 | B1 | 6/2021 |

*Primary Examiner* — Moazzam Hossain

(74) *Attorney, Agent, or Firm* — Seed Intellectual Property Law Group LLP

(57) ABSTRACT

The present disclosure relates to a display device. More particularly, the display device includes a touch sensor unit disposed on the encapsulation layer of the display panel and a lens layer disposed on the touch sensor unit, the touch sensor unit includes a plurality of bridge electrodes disposed on the encapsulation layer, an optical gap layer disposed on the bridge electrodes to expose at least a part of each of the plurality of bridge electrodes, and a touch electrode disposed to be in contact with each of the plurality of exposed bridge electrodes, and the optical gap layer includes a sub-lens layer disposed corresponding to the plurality of LEDs, a cylindrical structure layer disposed on the sub-lens layer to correspond to the plurality of LEDs, and an overcoating layer that covers the sub-lens layer and the cylindrical structure layer to planarize an upper surface.

20 Claims, 10 Drawing Sheets

(56) References Cited

U.S. PATENT DOCUMENTS

| | | | | |
|---|---|---|---|---|
| 2021/0391513 | A1* | 12/2021 | Choi | H10H 20/855 |
| 2022/0190295 | A1* | 6/2022 | Son | H10K 59/124 |
| 2022/0291507 | A1* | 9/2022 | Morrison | G02B 3/0006 |
| 2022/0319225 | A1* | 10/2022 | Yeh | G06F 3/0412 |
| 2024/0034852 | A1* | 2/2024 | Zhao | C08J 9/35 |

* cited by examiner

DISPLAY DEVICE

CROSS-REFERENCE TO RELATED APPLICATIONS

This application claims the priority of Korean Patent Application No. 10-2022-0190339 filed on Dec. 30, 2022, in the Korean Intellectual Property Office, the disclosure of which is incorporated herein by reference.

BACKGROUND

Technical Field

The present disclosure relates to a display device, and more particularly, to a display device with increased front luminance and improved viewing angle blocking efficiency.

Description of the Related Art

An organic light-emitting diode (OLED) serving as a self-emitting element includes an anode, a cathode and an organic compound layer formed between the anode and the cathode. The organic compound layer includes a hole transport layer (HTL), an emission layer (EML), and an electron transport layer (ETL). When a driving voltage is applied to the anode and the cathode, holes passing through the HTL and electrons passing through the ETL move to the EML and form excitons. As a result, the EML generates visible light. An organic light-emitting display device includes OLEDs capable of emitting light by themselves unlike a liquid crystal display device including a separate backlight. Also, the organic light-emitting display device has advantages of fast response time, high emission efficiency, high luminance, and wide viewing angle. Thus, the organic light-emitting display device has been used in various fields.

BRIEF SUMMARY

Generally, an organic light-emitting display device is not limited in viewing angle, but it is beneficial to have a limited viewing angle for various reasons including, but not limited to, privacy protection and information protection.

Further, such feature of limiting a viewing angle of the display device varies depending on whether a vehicle is driven and whether a driver and a passenger are viewing the display device. Therefore, it is beneficial to have a display device capable of selectively switching a viewing angle of the display device.

Relatedly, in some countries, exposure of multimedia played back in front of a passenger seat to a driver is prohibited. Therefore, it is beneficial if a viewing angle can be selectively switched.

According to some approaches in the related art, a display device whose viewing angle may be controlled by laminating a viewing angle control element, a light control film and a touch sensor unit on a display panel has been developed. However, as for the display device according to these approaches, the viewing angle control element, the light control film, and the touch sensor unit are individually fabricated on respective substrates and then laminated. Thus, according to such approach, the structure becomes complicated and it is difficult to slim down the display device.

One or more embodiments of the present disclosure address the various technical problems in the related art including the problems identified above.

For example, one or more embodiments of the present disclosure provide a display device in which components for controlling a viewing angle are embedded. Thus, the display device has a simple stack structure and excellent viewing angle control efficiency.

One or more embodiments of the present disclosure provide a display device which has increased front luminance by improving light extraction efficiency and also has increased viewing angle control efficiency.

One or more embodiments of the present disclosure provide a display device in which a viewing angle control structure may be effectively implemented and which has improved touch sensing performance.

Technical benefits of the present disclosure are not limited to the above-mentioned benefits, and other benefits, which are not mentioned above, can be clearly understood by those skilled in the art from the following descriptions.

According to an aspect of the present disclosure, the display device includes a substrate, a plurality of light emitting diodes (LEDs) disposed on the substrate and an encapsulation layer disposed to cover the plurality of LEDs. Also, the display device includes a touch sensor unit disposed on the encapsulation layer and a lens layer disposed on the touch sensor unit. The touch sensor unit includes a plurality of bridge electrodes disposed on the encapsulation layer and an optical gap layer disposed on the bridge electrodes to expose at least a part of each of the plurality of bridge electrodes. Also, the touch sensor unit includes a touch electrode disposed to be in contact with each of the plurality of exposed bridge electrodes. The optical gap layer includes a sub-lens layer disposed corresponding to the plurality of LEDs and a cylindrical structure layer disposed on the sub-lens layer to correspond to the plurality of LEDs. Also, the optical gap layer includes an overcoating layer that covers the sub-lens layer and the cylindrical structure layer to planarize an upper surface.

Other detailed matters of the exemplary embodiments are included in the detailed description and the drawings.

According to some embodiments of the present disclosure, a display device in which components for controlling a viewing angle are embedded by applying an optical gap layer to a touch sensor unit and a lens layer onto the touch sensor unit is described.

According to some embodiments of the present disclosure, a display device which has excellent front luminance and viewing angle control efficiency by securing an optical distance with an optical gap layer is described.

According to some embodiments of the present disclosure, a display device in which an optical gap layer including a sub-lens layer and a cylindrical structure layer condenses light emitted from an emission unit to greatly improve front luminance and increase viewing angle blocking efficiency, at the same time is described. Also, the optical gap layer improves a color shift, and, thus, the display device has excellent display quality.

One or more embodiments of the present disclosure can address the processing problems, such as bad adhesion and an under-cut, occurring when an optical gap layer having a large thickness is applied.

According to some embodiments of the present disclosure, it is possible to reduce a parasitic capacitance and thus possible to improve touch sensing characteristics.

The technical benefits according to the present disclosure are not limited to the contents exemplified above, and other various benefits will be evident based on the present disclosure.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
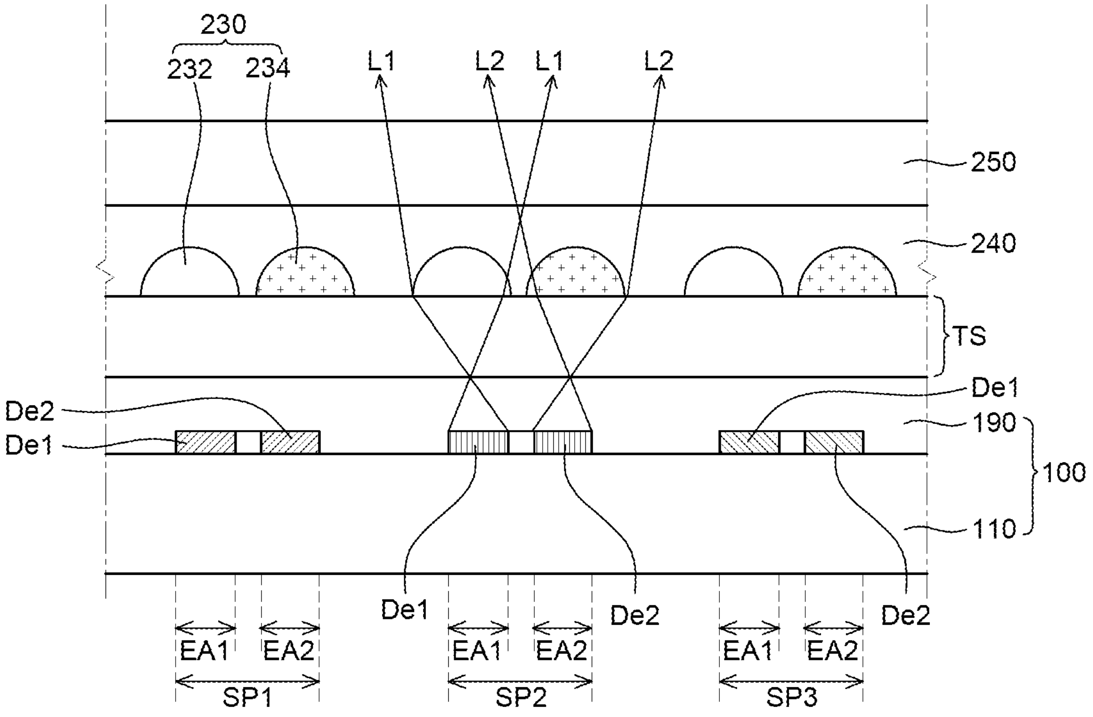
FIG. 1 is a schematic cross-sectional view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, number of elements, and the like illustrated in the accompanying drawings for describing the exemplary embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 2:
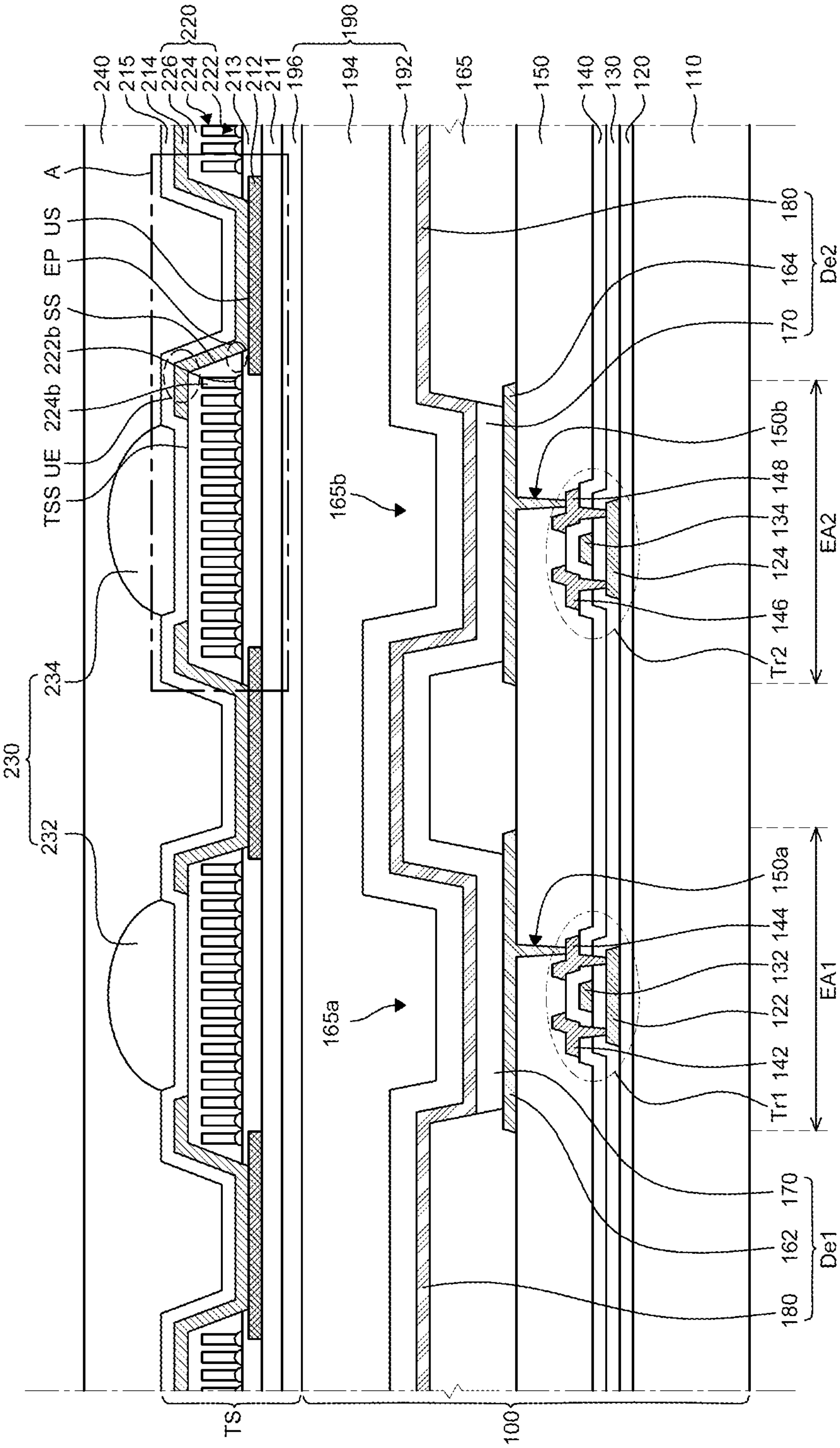
FIG. 2 is an enlarged cross-sectional view of a sub-pixel in the display device according to an exemplary embodiment of the present disclosure.

FIG. 1 is a schematic cross-sectional view of a display device according to an exemplary embodiment of the present disclosure. FIG. 2 is an enlarged cross-sectional view of a sub-pixel in the display device according to an exemplary embodiment of the present disclosure.

As shown in FIGS. 1 and 2, the display device according to an exemplary embodiment of the present disclosure includes a display panel 100, a touch sensor unit TS, a lens layer 230, a planarization film 240, and a polarization layer 250. The touch sensor unit TS includes a touch buffer layer 211, a bridge electrode 212, a touch insulating layer 213, an optical gap layer 220, and a touch electrode 214.

The display panel 100 includes a substrate 110, a plurality of thin film transistors Tr1 and Tr2, a plurality of LEDs De1 and De2, and an encapsulation layer 190.

A plurality of sub-pixels is defined on the substrate 110. For example, a first sub-pixel SP1, a second sub-pixel SP2, and a third sub-pixel SP3 are defined on the substrate 110. Each of the first sub-pixel SP1, the second sub-pixel SP2, and the third sub-pixel SP3 includes a first emission area EA1 and a second emission area EA2.

A first LED De1 is provided in the first emission area EA1, and a second LED De2 is provided in the second emission area EA2. For instance, the first emission area EA1 at least partially overlaps with the location where the first LED De1 is provided and the second emission area EA2 at least partially overlaps with the location where the second LED De2 is provided.

The first sub-pixel SP1, the second sub-pixel SP2, and the third sub-pixel SP3 may be a red sub-pixel, a green sub-pixel, and a blue sub-pixel, respectively. Thus, the first LED De1 and the second LED De2 of the first sub-pixel SP1 may emit red light, and the first LED De1 and the second LED De2 of the second sub-pixel SP2 may emit green light. Also, the first LED De1 and the second LED De2 of the third sub-pixel SP3 may emit blue light.

The encapsulation layer 190 having a flat upper surface is provided on the first LED De1 and the second LED De2 to protect the first LED De1 and the second LED De2 against foreign external materials such as moisture and oxygen.

A detailed configuration of the display panel 100 will be described in detail later.

The touch sensor unit TS is disposed on the display panel 100, specifically on the encapsulation layer 190 to provide a touch sensing function. As described above, the touch sensor unit TS includes the touch buffer layer 211, the bridge electrode 212, the touch insulating layer 213, the optical gap layer 220, the touch electrode 214, and a touch protective layer 215.

The touch electrode 214 is configured to sense a touch input. The touch electrode 214 may be composed of a plurality of sensing electrodes and a plurality of driving electrodes, and may detect touch coordinates by sensing a change in capacitance therebetween.

The display device according to an exemplary embodiment of the present disclosure does not have a structure in which a touch panel including electrodes, such as a bridge electrode and a touch electrode, on a separate substrate is disposed on a display panel through an adhesive member. Instead, the display device has a structure in which the bridge electrode 212 and the touch electrode 214 are disposed on the encapsulation layer 190 without a separate substrate and an adhesive member. Accordingly, the display device according to the present disclosure has a simple stack structure with less layers than a display device according to the related art. This can have the benefit of having a display device with smaller thickness. It may also remove several manufacturing processes (e.g., adhesion process) which can lead to decreasing the overall cost of the display device and also making it possible to manufacture the device faster.

The optical gap layer 220 is provided inside the touch sensor unit TS. The optical gap layer 220 secures an optical gap between the first and second LEDs De1 and De2 and lenses 232 and 234 of the lens layer 230 to allow light from the first LED De1 and the second LED De2 to be refracted by the lenses 232 and 234 in a specific direction. Thus, the optical gap layer 220 improves the efficiency of the lenses 232 and 234.

A detailed configuration of the touch sensor unit TS will be described in detail later.

The lens layer 230 is provided on the optical gap layer 220. The lens layer 230 includes a first lens 232 and a second lens 234. The first lens 232 is disposed in the first emission area EA1 to refract light from the first LED De1 in a specific direction. Also, the second lens 234 is disposed in the second emission area EA2 to refract light from the second LED De2 in a specific direction.

According to one embodiment, the first lens 232 is a half-spherical lens, and the second lens 234 is a half-cylindrical lens. Thus, first light L1 emitted from the first LED De1 of each of the sub-pixels SP1, SP2, and SP3 is refracted at a specific angle by the first lens 232 and then output. Also, second light L2 emitted from the second LED De2 of each of the sub-pixels SP1, SP2, and SP3 is refracted at a specific angle by the second lens 234 and then output. Accordingly, it is possible to limit a viewing angle of each of the sub-pixels SP1, SP2, and SP3.

The first lens 232 and the second lens 234 control different viewing angle directions from each other, and may be selectively operated to implement a wide viewing angle and a narrow viewing angle. This will be described in detail later.

The planarization film 240 is provided on the lens layer 230 to protect the first lens 232 and the second lens 234. The planarization film 240 is made of an organic insulating material and has a flat upper surface. Also, the planarization film 240 has a lower refractive index than those of the first lens 232 and the second lens 234.

For example, the planarization film 240 may be made of photo acryl, benzocyclobutene (BCB), polyimide (PI), or polyamide (PA), but is not limited thereto.

As shown in FIG. 1, at least one optical functional layer such as a polarization layer 250 may be disposed on the planarization film 240. The polarization layer 250 serves to change a polarization state of external light incident into the display panel 100, and suppress re-emission of external light reflected from the display panel 100 to the outside.

The display panel 100 and the touch sensor unit TS of the display device according to an exemplary embodiment of the present disclosure will be described with reference to FIGS. 1 and 2.

As shown in FIG. 2, the display panel 100 of the display device according to an exemplary embodiment of the present disclosure includes the substrate 110, the plurality of thin film transistors Tr1 and Tr2, the plurality of LEDs De1 and De2, and the encapsulation layer 190.

Specifically, each of the sub-pixels SP1, SP2, and SP3 on the substrate 110 includes the first emission area EA1 and the second emission area EA2. The substrate 110 may be a glass substrate or a plastic substrate. For example, the plastic substrate may be made of polyimide (PI), but is not limited thereto.

A substrate buffer layer 120 is disposed on the substrate 110. The substrate buffer layer 120 is positioned on substantially the entire surface of the substrate 110. The substrate buffer layer 120 suppresses introduction of moisture or foreign matters from the substrate 110 into the thin film transistors Tr1 and Tr2.

For example, the substrate buffer layer 120 may be made of an inorganic material such as silicon oxide ($SiO_2$) or silicon nitride ($SiN_x$), and may be configured by a single layer or a plurality of layers.

A first semiconductor layer 122 and a second semiconductor layer 124 are patterned in the first emission area EA1 and the second emission area EA2, respectively, on the substrate buffer layer 120. Each of the first semiconductor layer 122 and the second semiconductor layer 124 may be independently made of an oxide semiconductor material or polycrystalline silicon.

The first semiconductor layer 122 and the second semiconductor layer 124 may be made of an oxide semiconductor material. In this case, a shield pattern may be further formed under the first semiconductor layer 122 and the second semiconductor layer 124. The shield pattern blocks light incident into the first semiconductor layer 122 and the second semiconductor layer 124 and thus suppresses thermal degradation of the first semiconductor layer 122 and the second semiconductor layer 124.

Alternatively, the first semiconductor layer 122 and the second semiconductor layer 124 may be made of polycrystalline silicon. In this case, both edges of each of the first semiconductor layer 122 and the second semiconductor layer 124 may be doped with impurities.

A gate insulating film 130 made of an insulating material is formed on the first semiconductor layer 122 and the second semiconductor layer 124. The gate insulating film 130 may be made of an inorganic insulating material such as silicon oxide ($SiO_2$) or silicon nitride ($SiN_x$).

A first gate electrode 132 and a second gate electrode 134 made of a conductive material such as metal are formed on the gate insulating film 130 corresponding to the first semiconductor layer 122 and the second semiconductor layer 124, respectively.

FIG. 2 illustrates that the gate insulating film 130 is formed on substantially the entire surface of the substrate 110. For another example, the gate insulating film 130 may be patterned to have the same shape as the first gate electrode 132 and the second gate electrode 134.

An interlayer insulating film 140 made of an insulating material is formed on the first gate electrode 132 and the second gate electrode 134 substantially over the entire surface of the substrate 110. The interlayer insulating film 140 may be made of an inorganic insulating material such as silicon oxide ($SiO_2$) or silicon nitride ($SiN_x$), or may be made of an organic insulating material such as photo acryl or benzocyclobutene.

The interlayer insulating film 140 includes contact holes that expose an upper surface of each of the first semiconductor layer 122 and the second semiconductor layer 124. The contact holes may also be formed in the gate insulating film 130. First source and drain electrodes 142 and 144 and second source and drain electrodes 146 and 148 made of a conductive material such as metal are formed in the first emission area EA1 and the second emission area EA2, respectively, on the interlayer insulating film 140.

The first source electrode 142 and the first drain electrode 144 are in contact with both sides of the first semiconductor layer 122 through the contact holes of the interlayer insulating film 140. The second source electrode 146 and the second drain electrode 148 are in contact with both sides of the second semiconductor layer 124 through the contact holes of the interlayer insulating film 140.

The first semiconductor layer 122, the first gate electrode 132, the first source electrode 142 and the first drain electrode 144 constitute a first thin film transistor Tr1. Also, the second semiconductor layer 124, the second gate electrode 134, the second source electrode 146 and the second drain electrode 148 constitute a second thin film transistor Tr2.

At least one thin film transistor having the same structure as the first thin film transistor Tr1 and the second thin film transistor Tr2 may be further formed on the substrate 110 of each of the sub-pixels SP1, SP2, and SP3. However, the present disclosure is not limited thereto.

A protective film 150 made of an insulating material is formed on the first source electrode 142, the first drain electrode 144, the second source electrode 146, and the second drain electrode 148 substantially over the entire surface of the substrate 110. The protective film 150 may be made of an organic insulating material such as photo acryl or benzocyclobutene. The protective film 150 has a flat upper surface.

Meanwhile, an insulating film made of an inorganic insulating material such as silicon oxide ($SiO_2$) or silicon nitride ($SiN_x$) may be further formed under the protective film 150. That is, the insulating film may be further formed between the first and second thin film transistors Tr1 and Tr2 and the protective film 150.

The protective film 150 includes a first drain contact hole 150*a* and a second drain contact hole 150*b* that expose the first drain electrode 144 and the second drain electrode 148, respectively.

A first anode electrode 162 and a second anode electrode 164 made of a conductive material having a relatively high work function are formed on the protective film 150. The first anode electrode 162 is positioned in the first emission area EA1, and is in contact with the first drain electrode 144 through the first drain contact hole 150*a*. Also, the second anode electrode 164 is positioned in the second emission area EA2, and is in contact with the second drain electrode 148 through the second drain contact hole 150*b*.

For example, each of the first anode electrode 162 and the second anode electrode 164 may be made of a transparent conductive material such as indium tin oxide (ITO) or indium zinc oxide (IZO), but is not limited thereto.

Meanwhile, the display panel 100 according to an exemplary embodiment of the present disclosure may be of a top emission type where light from the plurality of LEDs De1 and De2 is output in a direction opposite to the substrate 110. Accordingly, each of the first anode electrode 162 and the second anode electrode 164 may further include a reflective electrode or reflective layer made of a metal material having high reflectivity under the transparent conductive material. For example, the reflective electrode or reflective layer may be made of an aluminum-palladium-copper (APC) alloy, silver (Ag) or aluminum (Al). In this case, each of the first anode electrode 162 and the second anode electrode 164 may have a triple-layer structure of ITO/APC/ITO, ITO/Ag/ITO or ITO/Al/ITO, but is not limited thereto.

A bank 165 made of an insulating material may be formed on the first anode electrode 162 and the second anode electrode 164. The bank 165 overlaps edges of the first anode electrode 162 and the second anode electrode 164, and covers the edges of the first anode electrode 162 and the second anode electrode 164. The bank 165 includes a first opening 165*a* and a second opening 165*b* that expose the first anode electrode 162 and the second anode electrode 164, respectively.

The bank 165 has a single-layer structure in the present disclosure, but may have a double-layer structure. For example, the bank 165 may have a double-layer structure including a lower bank which is hydrophilic and an upper bank which is hydrophobic.

An emission layer 170 is formed on the first anode electrode 162 and the second anode electrode 164 exposed through the first opening 165*a* and the second opening 165*b* of the bank 165. The emission layer 170 on the first anode electrode 162 and the emission layer 170 on the second anode electrode 164 are connected to each other as one body. However, the present disclosure is not limited thereto. Alternatively, the emission layer 170 on the first anode electrode 162 and the emission layer 170 on the second anode electrode 164 may be separated from each other.

The emission layer 170 may include a first charge auxiliary layer, a light-emitting material layer and a second charge auxiliary layer sequentially positioned on the first anode electrode 162 and the second anode electrode 164. The light-emitting material layer may be made of any one of red, green and blue light-emitting materials, but is not limited thereto. The light-emitting materials may be organic light-emitting materials such as phosphorescent compounds or fluorescent compounds. However, the present disclosure is not limited thereto. An inorganic light-emitting material such as a quantum dot may also be used.

The first charge auxiliary layer may include at least one of a hole injection layer (HIL) and a hole transport layer (HTL). Also, the second charge auxiliary layer may include at least one of an electron injection layer (EIL) and an electron transport layer (ETL).

A cathode electrode 180 made of a conductive material having a relatively low work function is formed on the emission layer 170 substantially over the entire surface of the substrate 110. Herein, the cathode electrode 180 may be made of aluminum, magnesium, silver or an alloy thereof. In this case, the cathode electrode 180 has a relatively small thickness to transmit light from the emission layer 170.

Alternatively, the cathode electrode 180 may be made of a transparent conductive material such as indium gallium oxide (IGO), but is not limited thereto.

The display panel 100 according to an exemplary embodiment of the present disclosure may be of the top emission type where light from the emission layer 170 of the first LED De1 and the second LED De2 is output in a direction opposite to the substrate 110, e.g., to the outside through the cathode electrode 180. The top emission type may have a greater emission area than a bottom emission type having the same size, and thus may have improved luminance and reduced power consumption.

The encapsulation layer 190 is formed on the cathode electrode 180 substantially over the entire surface of the substrate 110. The encapsulation layer 190 suppresses introduction of moisture or oxygen from the outside into the first LED De1 and the second LED De2. The encapsulation layer 190 may be configured by a single layer or a plurality of layers. For example, the encapsulation layer 190 may have a laminated structure including a first inorganic film 192, an organic film 194 and a second inorganic film 196. Herein, the organic film 194 may serve to cover foreign matters generated during a manufacturing process.

The touch sensor unit TS is provided on the encapsulation layer 190. As described above, the touch sensor unit TS includes the touch buffer layer 211, the bridge electrode 212, the touch insulating layer 213, the optical gap layer 220, the touch electrode 214, and the touch protective layer 215.

The touch buffer layer 211 is formed on the encapsulation layer 190 substantially over the entire surface of the substrate 110. The touch buffer layer 211 suppresses permeation of a chemical solution, such as a developing solution or an etching solution, used for manufacturing the bridge electrode 212 and the touch electrode 214 of the touch sensor unit TS or foreign matters. Thus, the touch buffer layer 211 protects the LEDs De1 and De2 so as not to be damaged.

For example, the touch buffer layer 211 may be made of an inorganic material such as silicon oxide ($SiO_2$) or silicon nitride ($SiN_x$). Also, the touch buffer layer 211 may be configured by a single layer or a plurality of layers.

A plurality of bridge electrodes 212 is formed on the touch buffer layer 211. The bridge electrode 212 may be formed corresponding to at least a part between the first to third sub-pixels SP1, SP2 and SP3 adjacent to each other and between the first emission area EA1 and the second emission area EA2.

The bridge electrode 212 electrically connects at least some of a plurality of touch electrodes 214 formed on the touch insulating layer 213 made of an insulating material. As described above, the plurality of touch electrodes 214 includes a plurality of sensing electrodes and a plurality of driving electrodes. The plurality of sensing electrodes and the plurality of driving electrodes are disposed on the same plane, and the bridge electrode 212 is disposed on a different layer from the plurality of touch electrodes 214. The bridge electrode 212 electrically connects the adjacent sensing electrodes or adjacent driving electrodes at the intersection area between the sensing electrode and the driving electrode. Thus, the bridge electrode 212 suppresses the sensing electrode and the driving electrode from short-circuiting at the intersection area each other.

The bridge electrode 212 may be made of a metal selected from molybdenum (Mo), aluminum (Al), chromium (Cr), gold (Au), titanium (Ti), nickel (Ni), copper (Cu), neodymium (Nd), tungsten (W) and an alloy thereof, but is not limited thereto. The bridge electrode 212 may have a monolayer structure or a multilayer structure.

The touch insulating layer 213 may be formed on the bridge electrode 212. The touch insulating layer 213 is formed on substantially the entire surface of the substrate 110. The touch insulating layer 213 insulates the bridge electrode 212 from the sensing electrode or driving electrode of the plurality of touch electrodes 214. Also, the touch insulating layer 213 is disposed between the bridge electrodes 212 and insulates the adjacent bridge electrodes 212 from each other. The optical gap layer 220 disposed on the touch insulating layer 213 is made of an insulating material. Thus, the touch insulating layer 213 may be selectively omitted, if necessary.

The touch insulating layer 213 includes a contact hole for electrically connecting the bridge electrode 212 and a part of the touch electrode 214. The touch insulating layer 213 overlaps an edge of the bridge electrode 212, and covers the edge of the bridge electrode 212. The contact hole of the touch insulating layer 213 exposes an upper surface of the bridge electrode 212, and the bridge electrode 212 is in contact with the touch electrode 214 through the contact hole.

The touch insulating layer 213 may be made of an inorganic material such as silicon oxide ($SiO_2$) or silicon nitride ($SiN_x$). Also, the touch insulating layer 213 may be configured by a single layer or a plurality of layers.

The optical gap layer 220 is formed on the touch insulating layer 213. As described above, the optical gap layer 220 secures an optical gap between the first and second LEDs De1 and De2 and the lenses 232 and 234 of the lens layer 230 to allow light from the first LED De1 and the second LED De2 to be refracted by the lenses 232 and 234 in a specific direction. Thus, the optical gap layer 220 improves the efficiency of the lenses 232 and 234.

In the display device according to an exemplary embodiment of the present disclosure, the optical gap layer 220 includes a sub-lens layer 222, a light guiding structure layer 224, and an overcoating layer 226. The light guiding structure layer 224 may also be referred to as a cylindrical structure layer 224 hereinafter. While the light guiding structure layer can have any shape suitable for guiding light, the term cylindrical structure layer 224 is used since the embodiment of FIG. 2 illustrates a cylindrical shape structure. However, the present disclosure is not limited to this shape and a person of ordinarily skill in the art may replace the cylindrical shape with a different shape that is capable of achieving the same technical benefit.

The sub-lens layer 222 is formed on the touch insulating layer 213. The sub-lens layer 222 is disposed to overlap the first LED De1 and the second LED De2. The sub-lens layer 222 is disposed on the touch insulating layer 213 to overlap an edge of each of the plurality of bridge electrodes 212.

The sub-lens layer 222 is formed to expose an upper surface of each of the plurality of bridge electrodes 212.

Thus, the sub-lens layer 222 is formed on the touch insulating layer 213 to overlap an edge of each of the plurality of bridge electrodes 212 and not to overlap the contact hole of the touch insulating layer 213. Therefore, the upper surface of the bridge electrode 212 exposed through the contact hole of the touch insulating layer 213 is in contact with the touch electrode 214.

The sub-lens layer 222 includes a plurality of sub-lenses 222*b*. The plurality of sub-lenses 222*b* is disposed to overlap the first LED De1 and the second LED De2. Some of the plurality of sub-lenses 222*b* may overlap an edge of the bridge electrode 212.

In one embodiment, the plurality of sub-lenses 222*b* may have a shape selected from a half-spherical shape and a spherical shape.

The plurality of sub-lenses 222*b* corresponding to the first LED De1 reduces (or minimizes) a loss of light emitted from the first LED De1 and thus improves light extraction efficiency. This will be described in detail later.

The cylindrical structure layer 224 is formed on the sub-lens layer 222. The cylindrical structure layer 224 is disposed to overlap the first LED De1 and the second LED De2. The cylindrical structure layer 224 may partially overlap the edge of each of the plurality of bridge electrodes 212.

The cylindrical structure layer 224 is formed to expose the upper surface of each of the plurality of bridge electrodes 212. Thus, the upper surface of the bridge electrode 212 exposed through the contact hole of the touch insulating layer 213 is in contact with the touch electrode 214.

The cylindrical structure layer 224 includes a plurality of light guiding structures 224*b*. As described above, the plurality of light guiding structures 224*b* may also be referred to as a plurality of cylindrical structures 224*b* hereinafter. However, as mentioned above, the light guiding structures are not limited to a cylindrical shape structure and any type or any shape of structure capable of providing a light condensed effect to improve luminance and light efficiency may be used.

Each of the plurality of cylindrical structures 224*b* may be disposed to be in contact with respective upper portions of the plurality of sub-lenses 222*b* of the sub-lens layer 222. In one or more embodiments, the plurality of cylindrical structures 224*b* is a hollow structure. The cross-sectional view of FIG. 2 illustrates the cylindrical structures 224*b* as having a bar shape in appearance. That is, the plurality of cylindrical structures 224*b* has a pipe shape or a tubular shape.

In one embodiment, each of the plurality of cylindrical structures 224*b* is provided to be perpendicular (or substantially perpendicular) to a lower surface of the sub-lens layer 222. Thus, light extracted from the sub-lens 222*b* of the sub-lens layer 222 is oriented perpendicularly by the cylindrical structure 224*b* provided upright and shows a condensed effect. Thus, the front luminance of the display device may be improved, and the viewing angle control efficiency may also be improved.

However, in other embodiments, each of the plurality of cylindrical structures 224*b* may be disposed in a direction that is transverse to the lower surface of the sub-lens layer 222. Accordingly, other embodiments may not require the cylindrical structures 224*b* to be strictly perpendicular to the lower surface of the sub-lens layer 222.

Further, in some embodiments, the plurality of cylindrical structures 224*b* may not be disposed on all of the sub-lens 222*b*. That is, in some cases, the number of cylindrical structures 224*b* may be smaller than the number of sub-lenses 222*b*.

A detailed configuration of the sub-lens layer 222 and the cylindrical structure layer 224 of the optical gap layer 220 will be described in detail later.

As described above, the optical gap layer 220 includes the overcoating layer 226. The overcoating layer 226 is disposed to cover the sub-lens layer 222 and the cylindrical structure layer 224. That is, the overcoating layer 226 is disposed to fill an empty space between the plurality of sub-lenses 222*b* and the plurality of cylindrical structures 224*b* and cover the sub-lens layer 222 and the cylindrical structure layer 224. Thus, the overcoating layer 226 planarizes an upper surface of the optical gap layer 220.

For the convenience of processing, the sub-lens layer 222 and the cylindrical structure layer 224 may be formed first and then, the overcoating layer 226 may be formed by applying an overcoat composition. Thus, the overcoating layer 226 is formed as one body over the sub-lens layer 222 and the cylindrical structure layer 224. However, the present disclosure is not limited thereto. After the plurality of sub-lenses 222*b* is formed, the overcoat composition may be applied first to planarize upper surface of the plurality of sub-lenses 222*b*. After the plurality of cylindrical structures 224*b* is formed, the overcoat composition may be applied secondarily to planarize upper surfaces of the plurality of cylindrical structures 224*b*. In this way, the overcoating layer 226 may be also formed.

The touch electrode 214 is disposed to cover the upper surface US of the bridge electrode 212 exposed through the contact hole of the touch insulating layer 213 and the contact hole of the optical gap layer 220, which are formed to overlap each other, and at least a part of the optical gap layer 220. The touch electrode 214 is in contact with the upper surface of the bridge electrode 212 exposed through the contact hole of the touch insulating layer 213 and the contact hole of the optical gap layer 220. Also, the touch electrode 214 is disposed to cover an end portion EP of the optical gap layer 220 and an upper edge UE of the optical gap layer 220. For example, the end portion EP of the optical gap layer 220 may be a portion that is located between the touch electrode 214 and the touch insulating layer 213. The end portion EP of the optical gap layer 220 may partially overlap with the bridge electrode 212 as shown in FIG. 2. The upper edge UE of the optical gap layer 220 may refer to a portion located adjacent to a top surface TSS and a side surface SS of the optical gap layer 220. As shown in FIG. 2, the touch electrode 214 covers the side surface SS of the optical gap layer 220 and partially covers the top surface TSS of the optical gap layer 220. The touch electrode 214 that is at the upper edge UE of the optical gap layer 220 partially overlaps with some of the sub-lenses 222*b* and the cylindrical structures 224*b*.

The touch electrode 214 is formed corresponding between the adjacent first to third sub-pixels SP1, SP2, and SP3 so as not to affect the light emission efficiency of the first emission area EA1 and the second emission area EA2. Alternatively, the touch electrode 214 is generally formed at a location between the first emission area EA1 and the second emission area EA2 so as not to affect the light emission efficiency. That is, in one embodiment, the touch electrode 214 is not disposed on the optical gap layer 220 corresponding to the first emission area EA1 and the second emission area EA2. In this case, it is possible to reduce (or minimize) a decrease in the light emission efficiency of the first emission area EA1 and the second emission area EA2.

The touch electrode 214 may be made of a metal selected from molybdenum (Mo), aluminum (Al), chromium (Cr), gold (Au), titanium (Ti), nickel (Ni), copper (Cu), neodymium (Nd), tungsten (W) and an alloy thereof, but is not limited thereto. The touch electrode 214 may have a mono-layer structure or a multilayer structure.

The touch protective layer 215 is formed on the touch electrode 214 and on the optical gap layer 220. In one embodiment, the touch protective layer 215 is formed on substantially the entire surface of the substrate 110. The touch protective layer 215 protects the touch electrode 214 against outdoor air such as moisture or oxygen and other foreign external matters. Also, the touch protective layer 215 protects the touch electrode 214 against a chemical solution, such as an etching solution, during a process of forming the lens layer 230.

The touch protective layer 215 may be made of an inorganic insulating material or an organic insulating material, and may be disposed by alternating an inorganic insulating material layer and an organic insulating material layer.

For example, the touch protective layer 215 may be made of an inorganic insulating material such as silicon nitride ($SiN_x$), silicon oxide ($SiO_x$), aluminum oxide ($AlO_x$) or silicon oxynitride (SiON). Alternatively, the touch protective layer 215 may be made of an organic insulating material such as acrylic resin, polyester-based resin, epoxy resin or silicon-based resin, but is not limited thereto. The touch protective layer 215 may be configured by a single layer or a plurality of layers.

The lens layer 230 is provided on the touch protective layer 215. As described above, the lens layer 230 includes the first lens 232 disposed in the first emission area EA1 and the second lens 234 disposed in the second emission area EA2. The first lens 232 and the second lens 234 control viewing angles in different directions from each other, and may be selectively operated to implement a wide viewing angle and a narrow viewing angle.

Hereinafter, an operation of selectively implementing a first mode as a share mode and a second mode as a private mode will be described in detail with reference to FIGS. 3 to 5.

Figure 3:
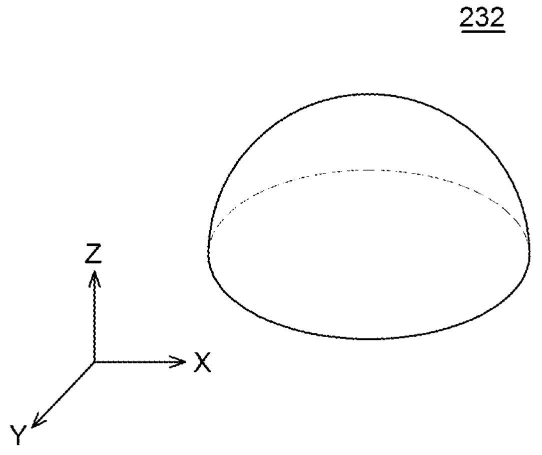
FIG. 3 is a schematic diagram illustrating a first lens of the display device according to an exemplary embodiment of the present disclosure.

FIG. 3 is a schematic diagram illustrating a first lens of the display device according to an exemplary embodiment of the present disclosure. FIG. 4 is a schematic diagram illustrating a second lens of the display device according to an exemplary embodiment of the present disclosure.

As shown in FIG. 3, the first lens 232 is a half-spherical lens having a semicircular cross-section in X- and Y-axis directions. Therefore, the first lens 232 controls (or adjusts) a viewing angle in the X- and Y-axis directions.

For example, the first emission area EA1 provided with the first lens 232 having a half-spherical shape may have a narrow viewing angle of less than 30 degrees in up and down directions (e.g., vertical direction) and left and right directions (e.g., horizontal direction) all together.

Figure 4:
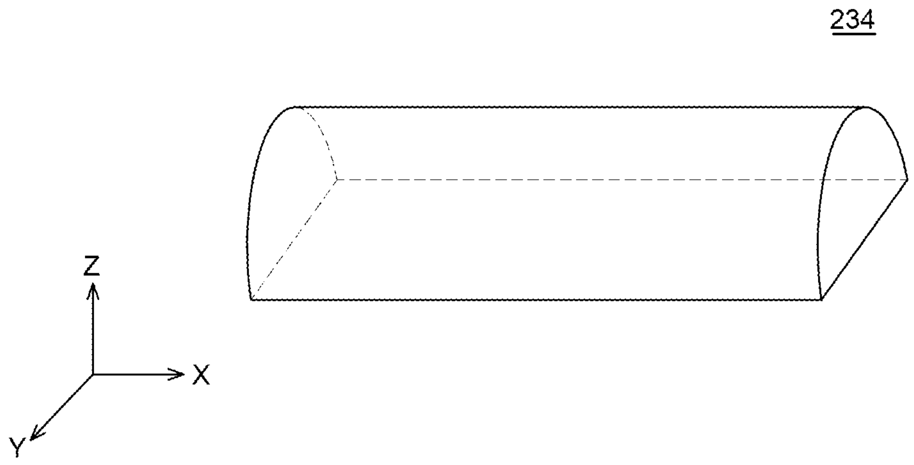
FIG. 4 is a schematic diagram illustrating a second lens of the display device according to an exemplary embodiment of the present disclosure.

However, as shown in FIG. 4, the second lens 234 is a half-cylindrical lens having a rectangular cross-section in the X-axis direction and a semicircular cross-section in the Y-axis direction. Therefore, the second lens 234 controls (or adjusts) the viewing angle in the Y-axis direction, but does not control the viewing angle in a longitudinal direction of the second lens 234, e.g., in the X-axis direction.

For example, the second emission area EA2 provided with the second lens 234 having a half-cylindrical shape may have a narrow viewing angle of less than 30 degrees in the up and down directions and a wide viewing angle of more than 60 degrees in the left and right directions.

Therefore, when the first emission area EA1 operates, the private mode in the up and down directions and the private mode in the left and right directions may be implemented. Also, when the second emission area EA2 operates, the private mode in the up and down directions and the share mode in the left and right directions may be implemented.

That is, in the display device according to an exemplary embodiment of the present disclosure, a narrow viewing angle in the up and down directions may be achieved by the first and second lenses 232 and 234 all the time. Also, the share mode and the private mode may be selectively implemented in the left and right directions.

Hereinafter, the share mode and the private mode in the left and right directions will be described with reference to FIG. 5.

Figure 5:
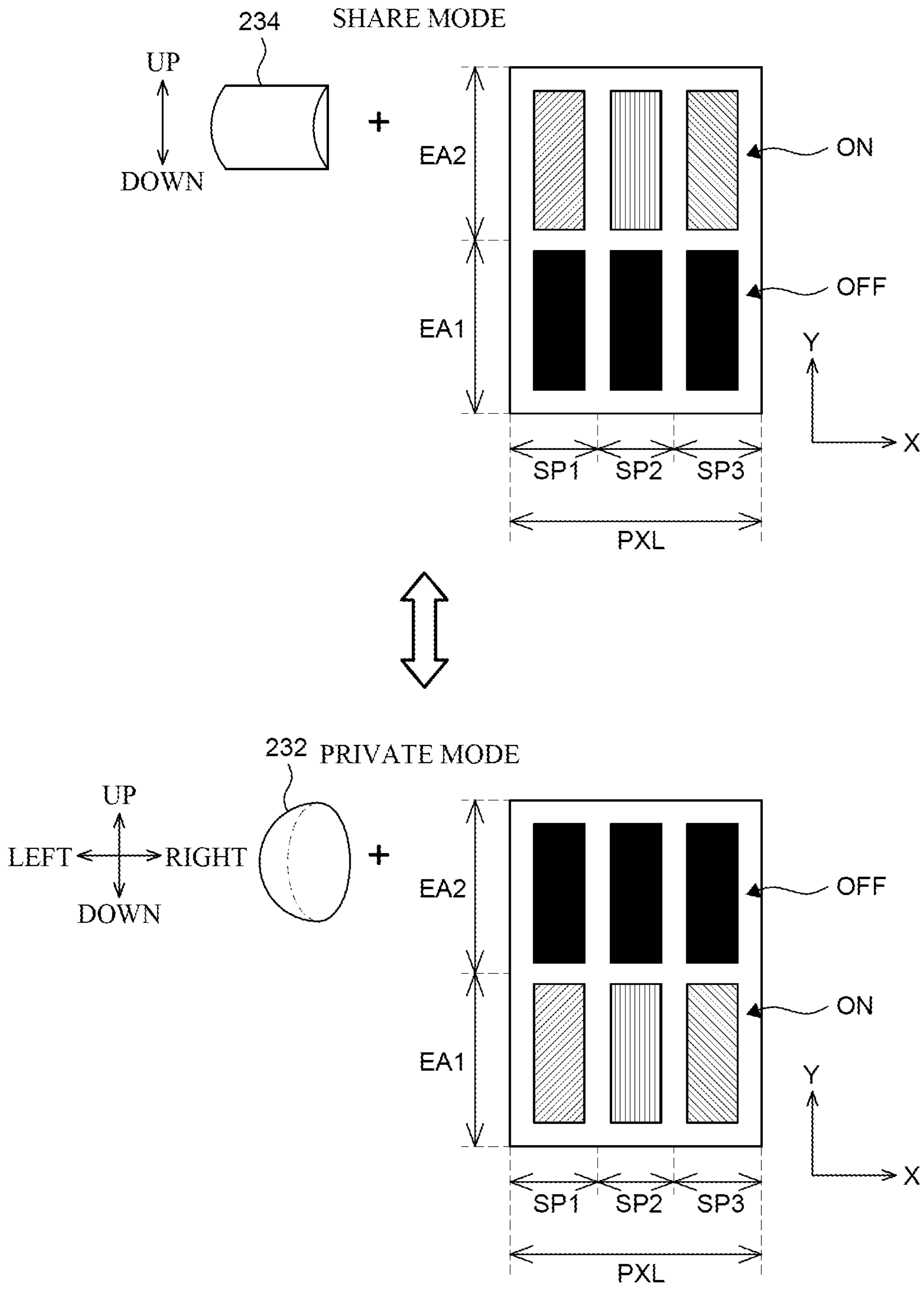
FIG. 5 is a schematic diagram illustrating a share mode operation and a private mode operation of the display device according to an exemplary embodiment of the present disclosure.

FIG. 5 is a schematic diagram illustrating a share mode operation and a private mode operation of the display device according to an exemplary embodiment of the present disclosure.

As shown in FIG. 5, a pixel PXL of the display device according to an exemplary embodiment of the present disclosure includes the first to third sub-pixels SP1, SP2, and SP3. Also, each of the first to third sub-pixels SP1, SP2, and SP3 includes the first emission area EA1 and the second emission area EA2.

The first lens 232 having a half-spherical shape is provided at a location corresponding to the first emission area EA1, and the second lens 234 having a half-cylindrical shape is provided at a location corresponding to the second emission area EA2.

In the share mode, the first LED De1 of the first emission area EA1 is turned off (see dark shades indicative of the LED being turned off) and the second LED De2 of the second emission area EA2 is turned on. Also, light emitted from the second LED De2 is controlled in viewing angle in the Y-axis direction, e.g., in the up and down directions, by the second lens 234, and output in the X-axis direction, e.g., in the left and right directions, without limitation of viewing angle. In other words, the viewing angle of the second lens 234 is different and in most cases larger than the viewing angle of the first lens 232.

Meanwhile, in the private mode, the first LED De1 of the first emission area EA1 is turned on and the second LED De2 of the second emission area EA2 is turned off. Also, light emitted from the first LED De1 is controlled in viewing angle in the up and down directions and the left and right directions by the first lens 232 and then output.

As described above, the display device according to an exemplary embodiment of the present disclosure has a narrow viewing angle in the up and down directions (e.g., vertical direction). If it is applied to a vehicle, it is possible to suppress blocking of the driver's view caused by reflection of an image from a front window of the vehicle.

Also, in the share mode, an image having a wide viewing angle in the left and right directions (e.g., horizontal direction) may be displayed. Further, in the private mode, an image having a narrow viewing angle in the left and right directions may be displayed. In the share mode, both users in a driver seat and a passenger seat may view the image. In the private mode, one of the users in the driver seat and the passenger seat may view the image. For instance, according to one embodiment of the private mode, the display device can display an image such that only one of the user sitting on either the driver seat or the passenger seat can view the image but not both at the same time. That is, in one embodiment, a degree of the viewing angle limited in the left direction can be different from a degree of the viewing angle limited in the right direction during the private mode so that only one of the users sitting on either the driver seat or the passenger seat can view the image from the display device.

For example, the viewing angle can be limited in the left direction (e.g., the direction of the driver seat) and not limited in the right direction (e.g., the direction of the passenger seat) such that only the user sitting on the passenger seat can view the image from the display device. Further, the share mode and the private mode may be selectively implemented in the left and right directions.

Also, when the first lens 232 and the second lens 234 are applied to condense light, the luminance increases compared to the same area size. Therefore, the display device of the present disclosure may lower a driving voltage. Since the first emission area EA1 and the second emission area EA2 may operate at a lower driving voltage, power consumption may be reduced, and luminance and heat generation may be reduced. Therefore, the lifespan of the plurality of LEDs De1 and De2 may be extended.

As described above, the optical gap layer 220 is provided in the touch sensor unit TS, and the first lens 232 corresponding to the first emission area EA1 and the second lens 234 corresponding to the second emission area EA2 are disposed on the optical gap layer 220. In this case, it is possible to selectively implement the share mode and the private mode by controlling a viewing angle. However, a part of light emitted from the first emission area EA1 and the second emission area EA2 is refracted by the first lens 232 and the second lens 234 and output. Therefore, the front luminance is decreased and a color shift occurs in a viewing angle direction. Accordingly, the optical characteristics and display quality of the display device may be degraded.

Also, if the optical gap layer 220 is provided in the touch sensor unit TS, it is beneficial for the optical gap layer 220 to be formed to a selected (or predetermined) thickness or more to secure a sufficient optical gap. However, a thick optical gap layer provided in the touch sensor unit TS to secure an optical gap may cause the following problems.

First, the optical gap layer is made of a transparent resin, and when the transparent resin is applied to a thickness required to secure an optical gap, it cannot be cured uniformly. Particularly, the transparent resin at a deep portion in contact with the touch insulating layer cannot be cured.

The non-cured optical gap layer may have a weak adhesive force and thus may cause bad adhesion such as interface de-bonding.

Also, the non-cured portion of the optical gap layer is etched with a chemical solution, such as an etching solution, used for development in a subsequent process for forming a touch electrode, and thus may have an under-cut defect. Such a defect becomes more severe as the thickness of the optical gap layer increases.

To solve these problems, the optical gap layer 220 of the display device according to an exemplary embodiment of the present disclosure includes the sub-lens layer 222 and the cylindrical structure layer 224.

Hereinafter, each of the sub-lens layer 222 and the cylindrical structure layer 224 of the optical gap layer 220 will be described in detail with reference to FIGS. 2, 6, 7A, 7B, and 7C.

Figure 6:
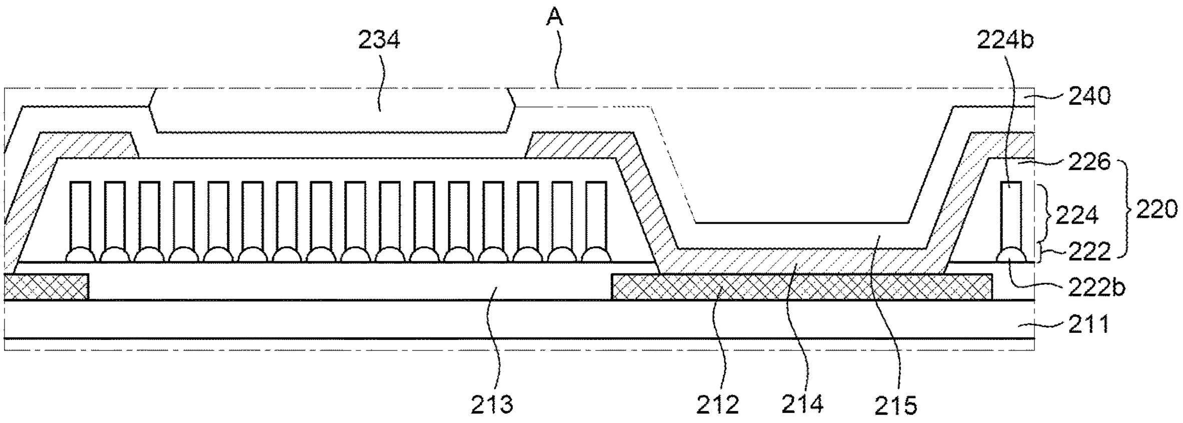
FIG. 6 is an enlarged view of an area A of FIG. 2.
Figure 7A:
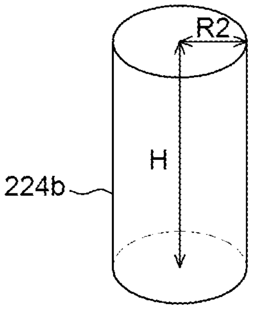
FIGS. 7A, 7B, and 7C are perspective views illustrating a partial area of an optical gap layer according to an exemplary embodiment of the present disclosure.
Figure 7B:
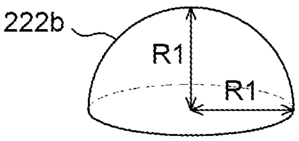
Figure 7C:
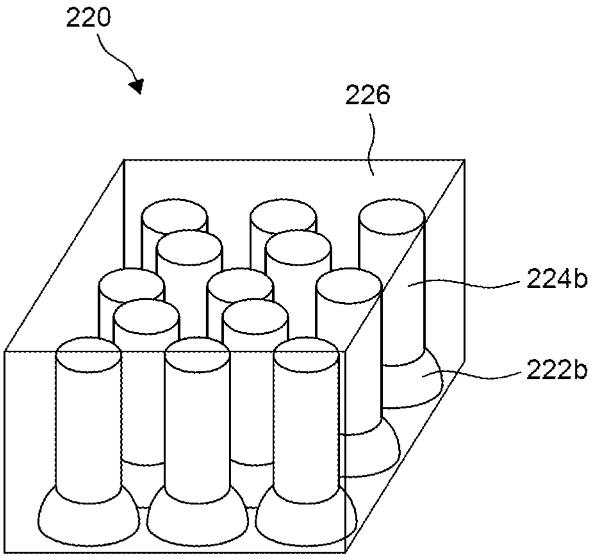

FIG. 6 is an enlarged view of an area A of FIG. 2. FIGS. 7A, 7B, and 7C are perspective views illustrating a partial area of an optical gap layer according to an exemplary embodiment of the present disclosure. In particular, FIG. 7A is a perspective view of a light guiding structure, 224*b*, FIG. 7B is a perspective view of a sub-lens 222*b*, and FIG. 7C is a perspective view of a partial area of an optical gap layer according to an exemplary embodiment of the present disclosure.

As described above, the optical gap layer 220 includes the sub-lens layer 222, the cylindrical structure layer 224, and the overcoating layer 226.

First, the sub-lens layer 222 includes the plurality of sub-lenses 222*b* disposed on the touch insulating layer 213 to overlap each of the first emission area EA1 and the second emission area EA2. The plurality of sub-lenses 222*b* is disposed to overlap each of the first LED De1 and the second LED De2. In the first emission area EA1, a single first LED De1 is provided, and the first lens 232 is disposed corresponding to the first LED De1. In the second emission area EA2, a single second LED De2 is provided, and the second lens 234 is disposed corresponding to the second LED De2. The plurality of sub-lenses 222*b* is disposed corresponding to the single first LED De1, and the plurality of sub-lenses 222*b* is disposed corresponding to the single second LED De2. Thus, the number of the plurality of sub-lenses 222*b* corresponding to the first LED De1 is greater than the number of first lenses 232 corresponding to the first LED De1. Also, the number of the plurality of sub-lenses 222*b* corresponding to the second LED De2 is greater than the number of second lenses 234 corresponding to the second LED De2. For example, two or more sub-lenses 222*b* may be disposed corresponding to the single first LED De1, and two or more sub-lenses 222*b* may be disposed corresponding to the single second LED De2. However, the present disclosure is not limited thereto. The numbers of first lenses 232 and sub-lenses 222*b* disposed in the first emission area EA1 and the numbers of the second lenses 234 and sub-lenses 222*b* disposed in the second emission area EA2 may be differently disposed depending on the need or design from the above description.

Each of the plurality of sub-lenses 222*b* is illustrated as a half-spherical lens in the drawing, but is not limited thereto. For another example, each of the plurality of sub-lenses 222*b* may be a half-cylindrical lens. For yet another example, some of the plurality of sub-lenses 222*b* may be half-spherical lenses, and the others may be half-cylindrical lenses.

The plurality of sub-lenses 222*b* may be aligned regularly, or may be aligned in a zigzag pattern or randomly.

Each of the respective layers constituting the display device are made of different materials from each other and thus have different refractive indexes. The layers are designed to gradually decrease from an LED to a display surface of the display device. For example, the touch buffer layer and the touch insulating layer may have a refractive index of 1.7 to 1.8, and the optical gap layer may have a refractive index of 1.5 to 1.6. If the refractive indexes are designed as described above, light emitted from the LED may be easily extracted to the outside. However, when light is incident at a threshold angle or more from a high refractive index layer to a low refractive index layer, total reflection occurs at an interface. Thus, a part of light incident from the LED at the threshold angle or more cannot be extracted to the outside and is lost at the interface of each layer due to the total reflection.

The display device according to an exemplary embodiment of the present disclosure is provided with the sub-lens layer 222 and thus may reduce or minimize the amount of light lost due to total reflection. Specifically, the sub-lens layer 222 includes the plurality of sub-lenses 222*b*. The plurality of sub-lenses 222*b* may form a low refractive index structure to lower an incident angle of incident light, and cause scattering and diffraction to reduce or minimize the amount of light lost due to total reflection. Thus, the light extraction efficiency may be enhanced.

For example, each of the plurality of sub-lenses 222*b* may have a radius R1 of 1 nm to 5 μm. In this range, a low refractive index structure may be formed by the plurality of sub-lenses 222*b*, and, thus, the light extraction efficiency may be improved.

For example, the sub-lens layer 222 may have a thickness of 5 μm or less. In this range, the light extraction efficiency improved compared to those display devices in the related art.

The plurality of sub-lenses 222*b* provides a large surface area. Thus, the sub-lens layer 222 enhances an interface adhesive force. Therefore, it is possible to solve defects such as bad adhesion, detachment or an under-cut caused by a decrease in adhesive force.

For example, the sub-lens layer 222, e.g., each of the plurality of sub-lenses 222*b*, may contain a transparent resin and nanoparticles.

As described above, if the transparent resin is applied thick to secure an optical gap and cured, it cannot be cured uniformly. Particularly, the transparent resin at a deep portion cannot be cured. The non-cured deep portion of the optical gap layer has a weak adhesive force and thus causes various defects such as bad adhesion, an under-cut and mura on the surface.

To address the above technical problem, the nanoparticles are mixed to enhance an adhesive force of the transparent resin. The nanoparticles are dispersed in the transparent resin. If the nanoparticles are dispersed in the transparent resin, the surface roughness increases, and, thus, the interface adhesive force is enhanced. Therefore, the interface adhesive force of the sub-lens layer 222 is further enhanced. Accordingly, it is possible to further suppress defects such as bad adhesion, detachment or an under-cut.

For example, the transparent resin may include one or more selected from acrylic resin, siloxane-based resin, polyimide-based resin, polyamide-based resin, cycloolefin-based resin and fluorine-based resin. Preferably, the transparent resin may be an acrylic resin or a siloxane-based resin that has excellent optical characteristics and may be easily obtained. A structure compound such as a norbornene group or an adamantly group may be selectively coupled to the transparent resin as necessary.

For example, the nanoparticles may be selected from fullerene, silica, zirconium oxide ($ZrO_2$) and titanium dioxide ($TiO_2$). These nanoparticles may improve the surface roughness without degrading the optical characteristics and thus enhances the interface adhesive force of the sub-lens layer 222.

For example, the nanoparticles may have a spherical shape, a cylindrical shape or a hollow shape. Particularly, if the nanoparticles have a hollow shape, it has a low refractive index. Thus, the light extraction efficiency may be further improved.

The cylindrical structure layer 224 is disposed on the sub-lens layer 222. The cylindrical structure layer 224 includes the plurality of cylindrical structures 224*b* disposed on the sub-lens layer 222 to overlap each of the first emission area EA1 and the second emission area EA2. The plurality of cylindrical structures 224*b* is disposed on the sub-lens layer 222 to overlap each of the first LED De1 and the second LED De2.

The plurality of cylindrical structures 224*b* is disposed to be in contact with the respective upper portions of the plurality of sub-lenses 222*b*. The plurality of cylindrical structures 224*b* may be disposed to be in contact with the plurality of sub-lenses 222*b*, respectively. That is, the single cylindrical structure 224*b* may be disposed to be in contact with the single sub-lens 222*b*. However, the present disclosure is not limited thereto, and two or more cylindrical structures 224*c*, 224*d* may also be disposed on the single sub-lens 222*b* as shown in FIG. 8.

Figure 8:
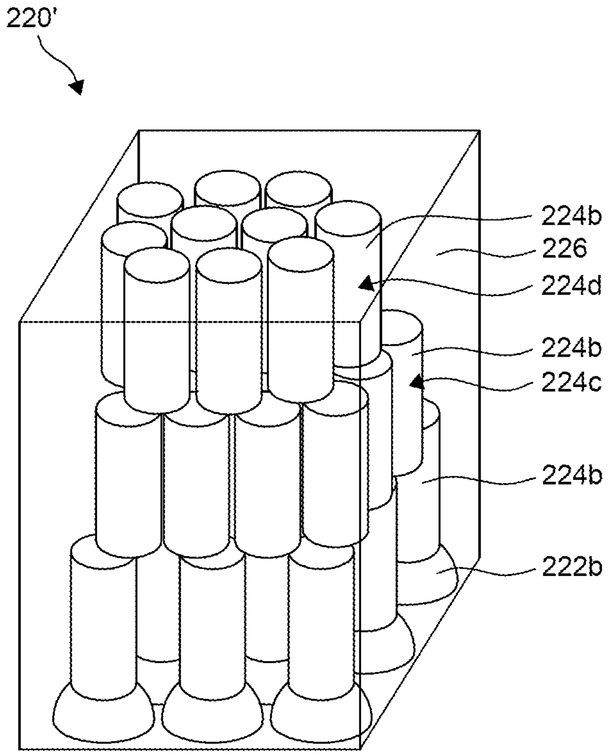
FIG. 8 is a perspective view illustrating a partial area of an optical gap layer according to another exemplary embodiment of the present disclosure.

The cylindrical structures 224*c* and the cylindrical structures 224*d* may be identical to cylindrical structures 224*b* but located at a different layer within the optical gap layer 220' as shown in FIG. 8. For instance, the cylindrical structure 224*b* may be located at a first layer, the cylindrical structure 224*c* may be located at a second layer that is on the first layer, and the cylindrical structure 224*d* may be located at a third layer that is on the second layer.

The cylindrical structures stacked in this manner can further improve light efficiency and luminance of the display device. While the respective cylindrical structure among structures 224*b*, 224*c*, 224*d* may be substantially identical to each other, the number of cylindrical structures in the first layer where cylindrical structures 224*b* are located may be different from the number of cylindrical structures in the second layer where cylindrical structures 224*c* are located. Further, the number of cylindrical structures in the third layer where cylindrical structures 224*c* are located may be different from the number of cylindrical structures in the second layer where cylindrical structures 224*c* are located. In other embodiments, the number of cylindrical structures located in respective first, second, and third layers may be identical to each other. However, as shown in FIG. 8, each cylindrical structure may be mounted on top of another cylindrical structure in a manner that the top cylindrical structure is not stacked to exactly overlap the bottom cylindrical structure. Such arrangement also can improve the light condense effect that can improve light efficiency and luminance of the display device. In one embodiment, a radius of a cylindrical structure (of the cylindrical structures 224*b* in the first layer) may be different from a radius of a cylindrical structure (of the cylindrical structures 224*c* in the second layer) or a radius of a cylindrical structure (of the cylindrical structures 224*d* in the third layer).

Further, in another embodiment, although not shown in FIG. 8, the cylindrical structures 224*b* in the first layer may have the same radius as the cylindrical structures 224*c* in the second layer (or the same radius as the cylindrical structures 224*d* in the third layer). Moreover, in some instances, the cylindrical structures may be mounted exactly on top of each other. That is, the cylindrical structures 224*c* in the second layer may be mounted exactly on top of the cylindrical structures 224*b* in the first layer, and the cylindrical structures 242*d* in the third layer may be mounted exactly on top of the cylindrical structures 224*c*.

The plurality of cylindrical structures 224*b* is provided upright on the plurality of sub-lenses 222*b*, respectively. That is, in one embodiment, the lower surface of the sub-lens layer 222 is perpendicular (or substantially perpendicular) to each of the plurality of cylindrical structures 224*b*. The single cylindrical structure 224*b* may be provided upright on the single sub-lens 222*b*. However, the present disclosure is not limited thereto, and two or more cylindrical structures 224*b* may also be provided upright on the single sub-lens 222*b* as shown in FIG. 8.

While there are some technical benefits for stacking a cylindrical structure 224*b* to be exactly upright (or perpendicular) on the single sub-lens 222*b*, this is not required in other embodiments. That is, a cylindrical structure 224*b* may be mounted on the single sub-lens 222*b* but not in a perpendicular manner as long as such arrangement condenses light so that the luminance of the display device increases. Accordingly, other embodiments may not require the cylindrical structures 224*b* to be strictly perpendicular to the sub-lens 222*b*.

According to one embodiment, the cylindrical structure 224*b* may be a vertical alignment filler. For example, the vertical alignment filler may be selected from carbon nanotubes, silicon-based nanotubes and acrylic nanotubes. These materials have vertical alignment properties and thus may improve the linearity of light. If carbon nanotubes are used as the vertical alignment filler, single-walled carbon nanotubes or multi-walled carbon nanotubes such as double-walled carbon nanotubes may be used.

For example, the cylindrical structure 224*b* may be formed by allowing the above-described material to be grown upright directly on the sub-lens layer 222. For another example, the cylindrical structure 224*b* may be provided upright on the sub-lens layer 222 by self-assembly. However, the present disclosure is not limited thereto.

The cylindrical structure layer 224 including the plurality of cylindrical structures 224*b* provided upright has a higher refractive index than the sub-lens layer 222. Thus, light extracted from the sub-lens layer 222 may be easily output. Specifically, the plurality of cylindrical structures 224*b* provided upright condenses light extracted from the sub-lens layer 222 and improves the linearity of light to suppress a leakage of light in a diagonal direction rather than a front direction. Thus, the luminance of the display device may be improved. Particularly, the display device according to an exemplary embodiment of the present disclosure may simultaneously improve the front luminance and the viewing angle control efficiency which have a trade-off relationship. Further, a color shift in the diagonal direction is improved, and, thus, the optical characteristics and display quality may be improved.

Also, the display device according to the present disclosure may lower a driving voltage. Since the display device may operate at a lower driving voltage, power consumption may be reduced. Since luminance and heat generation is reduced, the lifespan of LEDs is improved.

In one embodiment, a radius R2 of each of the plurality of cylindrical structures 224*b* is smaller than the radius R1 of sub-lens 222*b*. In this case, the linearity of light extracted from the sub-lens 222*b* is improved, and the luminance may be improved by condensing light.

For example, each of the plurality of cylindrical structures 224*b* may have a height H of 10 nm or more. In this range, the linearity of light extracted from the sub-lens 222*b* is improved and the condensation effect of light is improved. Thus, the luminance may be greatly improved.

For example, the cylindrical structure layer 224 may have a thickness of 1 μm or more. In this case, the linearity of light extracted from the sub-lens 222*b* is improved and a sufficient optical gap is secured. Thus, the viewing angle control efficiency is improved.

Meanwhile, FIG. 7C illustrates a structure in which the plurality of cylindrical structures 224*b* is formed as a single layer on the sub-lens layer 222. However, the present disclosure is not limited thereto.

In some preferred embodiments, the radius (R2) of the carbon nanotube is 1.0 nm to 5.0 nm and the height (H) is 0.5 um to 1.0 um. However, in other embodiments, the radius and height ratio can be varied in order to improve the light extraction effect.

FIG. 8 is a perspective view illustrating a partial area of an optical gap layer according to another exemplary embodiment of the present disclosure.

Referring to FIG. 8, the plurality of cylindrical structures 224*b* may also be laminated as a plurality of layers on the sub-lens layer 222. FIG. 8 illustrates a structure in which the plurality of cylindrical structures 224*b* is laminated as a triple layer on the sub-lens layer 222. However, the present disclosure is not limited thereto.

If the plurality of cylindrical structures 224*b* is laminated as a plurality of layers, the linearity of light and the condensation of light may be further improved.

As described above, the optical gap layer 220 includes the overcoating layer 226. The overcoating layer 226 is disposed to cover the sub-lens layer 222 and the cylindrical structure layer 224. That is, the overcoating layer 226 is disposed to fill an empty space between the plurality of sub-lenses 222*b* and the plurality of cylindrical structures 224*b* and cover the sub-lens layer 222 and the cylindrical structure layer 224. Thus, the overcoating layer 226 planarizes the upper surface of the optical gap layer 220.

The overcoating layer 226 may be made of a transparent resin. For example, the overcoating layer 226 may be made of one or more selected from acrylic resin, siloxane-based resin, polyimide-based resin, polyamide-based resin, cycloolefin-based resin, fluorine-based resin, photo acryl, benzocyclobutene and polyamide, but is not limited thereto.

Meanwhile, after the optical gap layer 220 is formed, the touch electrode 214 is formed through a deposition process. Unlike the optical gap layer 220, which is mainly made of an organic material such as a transparent resin, the touch electrode 214 is made of a metal. The transparent resin has a coefficient of thermal expansion (CTE) several times higher than the metal. Due to a difference in CTE, it is not easy to deposit the touch electrode 214 while the touch electrode 214 is formed on the optical gap layer 220, and deposition failure occurs. A large difference in CTE between two different materials causes a large difference in stress applied to each of the materials during a high temperature process. Therefore, warpage or de-bonding may occur.

Accordingly, a multifunctional crosslinker may be added to the overcoating layer 226 in order to make the CTE of the optical gap layer 220 similar to that of the metal. If the multifunctional crosslinker is mixed with the transparent resin, the transparent resin may be crosslinked while being cured, and, thus, the CTE may be decreased. Therefore, a difference in CTE between the optical gap layer 220 and the touch electrode 214 is reduced. Accordingly, it becomes easy to deposit the touch electrode 214 and it is possible to suppress the occurrence of deposition failure.

An acrylate-based compound that can be easily obtained may be used as the multifunctional crosslinker. For example, an acrylate-based compound having 3 to 9 functional groups may be used as the multifunctional crosslinker. Preferably, acrylate ester having 6 to 9 functional groups may be used as the multifunctional crosslinker. Also, two or more types of multifunctional crosslinkers different in the number of functional groups may be used together. If the multifunctional crosslinker having 6 to 9 functional groups is used, a crosslink density of the overcoating layer 226 is further increased. Thus, a difference in CTE from the touch electrode 214 can be further reduced.

The optical gap layer 220 secures an optical gap between the first and second LEDs De1 and De2 and the lenses 232 and 234 of the lens layer 230 and thus improves the efficiency of the lenses 232 and 234. However, the optical gap layer 220 increases the thickness of the touch sensor unit TS, which results in a decrease in touch sensitivity.

To compensate for the decrease in touch sensitivity, a molecular sieve may be applied to the overcoating layer 226.

The molecular sieve decreases a dielectric constant of the overcoating layer 226 and thus decreases a parasitic capacitance. Thus, the display device according to an exemplary embodiment of the present disclosure has excellent touch sensitivity although the optical gap layer 220 having a large thickness is provided in the touch sensor unit TS.

For example, the molecular sieve may be mesoporous silica. For specific example, mesoporous silica such as SBA-15 may be used for the molecular sieve. However, the present disclosure is not limited thereto.

For example, the optical gap layer 220 may have a dielectric constant of 3.6 or less and preferably from 2.8 to 3.6. In this range, the touch sensitivity is excellently improved.

As such, the optical gap layer 220 is formed to a predetermined thickness or more to secure an optical gap. For example, the optical gap layer 220 may have a thickness of from 2 μm to 20 μm. In this case, a sufficient optical gap between the first and second LEDs De1 and De2 and the lens layer 230 may be secured, and, thus, the efficiency may be improved. Preferably, the optical gap layer 220 may be formed to a thickness of 6 μm to 14 μm. In this range, the efficiency of the lenses 232 and 234 is much better. The thickness of the optical gap layer 220 is defined from a lower surface of the sub-lens layer 222 to an upper surface of the overcoating layer 226.

The present disclosure provides a display device in which the optical gap layer 220 is disposed in the touch sensor unit TS and the lens layer 230 is disposed on the touch sensor unit TS. Thus, the display device may control a viewing angle.

Also, the optical gap layer 220 of the present disclosure includes the sub-lens layer 222, the cylindrical structure layer 224 and the overcoating layer 226. The plurality of sub-lenses 222*b* of the sub-lens layer 222 reduces total reflection of light emitted from the LEDs De1 and De2 and then improves the light extraction efficiency. Further, the sub-lens layer 222 has a large surface area structure and thus enhances the interface adhesive force. Therefore, it is possible to solve defects such as bad adhesion or an under-cut.

In some embodiments, the dimensions of each cylinder 224*b* may be the same or different. For instance, the cylinders 224*b* mounted on the bottom (e.g., first level as shown in FIG. 8) may have the same dimensions (e.g., radius, height, diameter, etc.) with the cylinders 224*b* mounted on top of the first level (e.g., second level as shown in FIG. 8). Further, the cylinders 224*b* mounted on the second level may have the same dimensions as the cylinders 224*b* mounted on the third level shown in FIG. 8.

In some embodiments, the cylinders 224 can be stacked without any particular arrangement. In other embodiments, the cylinders 224 can be stacked in a particular arrangement such that the light extraction efficiency is further improved.

In some embodiments, the number of cylinders for each level (e.g., first level, second level, third level) may be the same or different.

Furthermore, the cylindrical structure layer 224 includes the plurality of cylindrical structures 224*b* and thus improves the linearity of light incident from the sub-lens layer 222 and condenses light.

Thus, the display device according to the present disclosure simultaneously improve the front luminance and the viewing angle control efficiency. Thus, provided is the optical characteristics and display quality improvement effect.

Hereinafter, the effects of the present disclosure will be described in more detail with reference to Example Embodiments and Comparative Examples. However, the following Example Embodiments are set forth to illustrate the present disclosure, but the scope of the present disclosure is not limited thereto.

Experimental Example 1

1) Example Embodiment 1

As shown in FIG. 2, a touch sensor unit in which an optical gap layer (6 μm thick) including a sub-lens layer and a cylindrical structure layer is embedded was disposed on a display panel. Also, a lens layer was laminated on the touch sensor unit to fabricate a display device whose viewing angle may be controlled.

2) Comparative Example 1

A display panel having a conventional structure without a light control film for controlling a viewing angle was prepared.

3) Comparative Example 2

A display device in which a light control film for controlling a viewing angle is laminated on a display panel was fabricated.

4) Comparative Example 3

A touch sensor unit was disposed on a display panel, and a separate optical gap layer was disposed on the touch sensor unit. Also, a lens layer was disposed on the optical gap layer to fabricate a display device whose viewing angle may be controlled. The optical gap layer was formed into a monolayer structure having a thickness of 6 μm using a transparent resin.

A luminance distribution for each viewing angle of each display device prepared according to Example Embodiment 1 and Comparative Examples 1 to 3 was analyzed, and the result thereof was shown in Table 1 and FIGS. 9A to 9D.

Figure 9A:
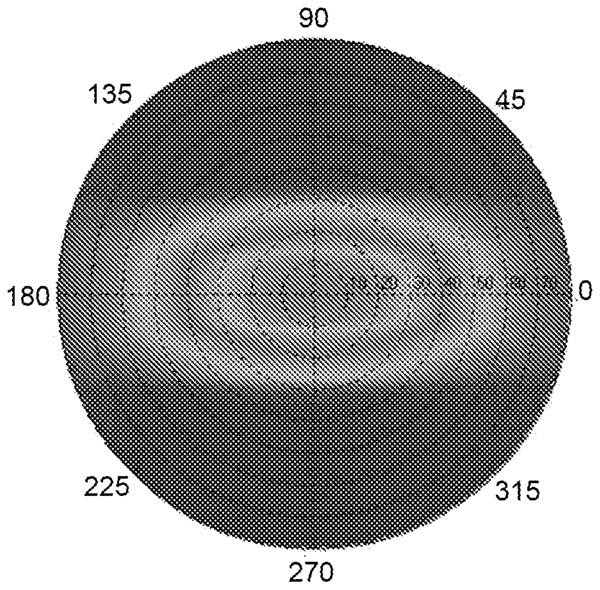
FIG. 9A is a graph showing a luminance distribution for each viewing angle of a display device according to Example Embodiment 1.
Figure 9B:
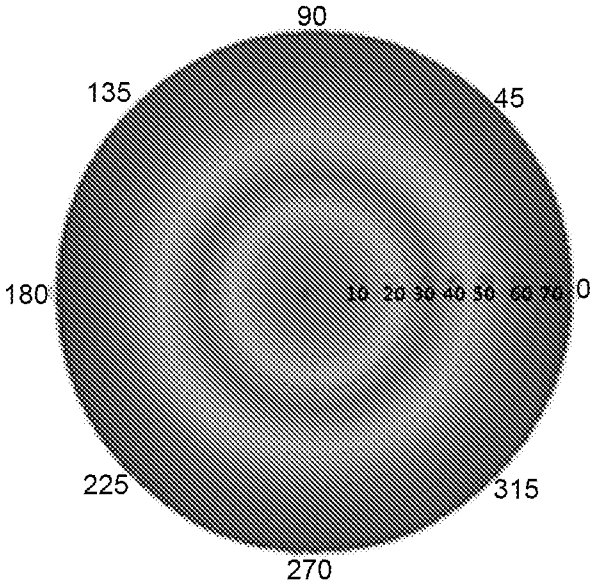
FIG. 9B is a graph showing a luminance distribution for each viewing angle of a display device according to Comparative Example 1.
Figure 9C:
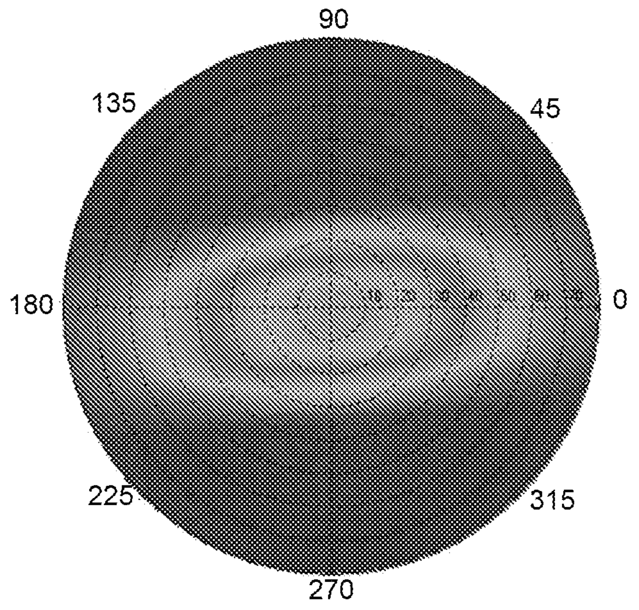
FIG. 9C is a graph showing a luminance distribution for each viewing angle of a display device according to Comparative Example 2.
Figure 9D:
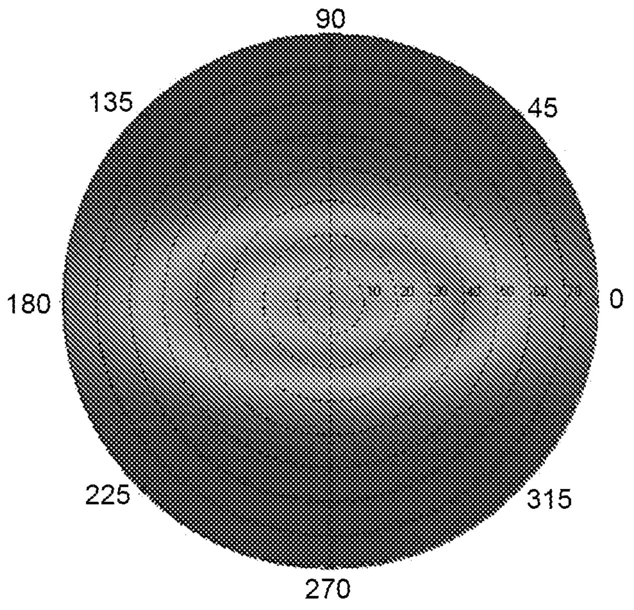
FIG. 9D is a graph showing a luminance distribution for each viewing angle of a display device according to Comparative Example 3.

FIG. 9A is a graph showing a luminance distribution for each viewing angle of a display device according to Example Embodiment 1, and FIG. 9B is a graph showing a luminance distribution for each viewing angle of a display device according to Comparative Example 1. FIG. 9C is a graph showing a luminance distribution for each viewing angle of a display device according to Comparative Example 2, and FIG. 9D is a graph showing a luminance distribution for each viewing angle of a display device according to Comparative Example 3.

TABLE 1

| Classification | | Example Embodiment 1 | Comparative Example 1 | Comparative Example 2 | Comparative Example 3 |
|---|---|---|---|---|---|
| Luminance | Front | 100% | 100% | 85% | 85% |
| | 30° in up and down directions | 5% | 56% | 9% | 7% |

Referring to Table 1 and FIG. 9B together, the display device of Comparative Example 1 without a light control film has a uniform luminance distribution for each viewing angle as shown in FIG. 9B. Also, the display device of Comparative Example 1 has a relative luminance of 56% at 30 degrees in up and down directions, which confirms that the viewing angle is not controlled.

Referring to Table 1 and FIG. 9C together, the display device of Comparative Example 2 including a light control film has a relative luminance of 9% at 30 degrees in the up and down directions, which confirms that the viewing angle control efficiency is excellent. However, the display device of Comparative Example 2 exhibits a lower front luminance of 85% than the display device of Comparative Example 1.

Referring to Table 1 and FIG. 9D together, the display device of Comparative Example 3 including an optical gap layer configured by a single transparent resin layer in a touch sensor unit and a lens layer on the touch sensor unit has a relative luminance of 7% at 30 degrees in the up and down directions, which confirms that the viewing angle control efficiency is excellent. However, the display device of Comparative Example 3 exhibits a low front luminance equivalent to that of the display device of Comparative Example 2.

On the contrary, the display device of Example Embodiment 1 exhibits a front luminance of 100% and a relative luminance of 5% at 30 degrees in the up and down directions, which confirms that it has excellent front luminance and the viewing angle control efficiency is most excellent. Particularly, when compared to the display device of Comparative Example 3 in which the optical gap layer is embedded in the touch sensor unit as in the display device of Example Embodiment 1, the display device of Example Embodiment 1 is improved in front luminance and viewing angle control efficiency.

An additional sample was fabricated by forming an optical gap layer having the same structure as that of the display device of Example Embodiment 1 and forming a metal electrode pattern thereon. Then, the dielectric constant, photocuring sensitivity, adhesiveness, remaining film ratio and touch sensitivity of the optical gap layer were evaluated. As a result of evaluation, the optical gap layer has a dielectric constant of 2.9 (100 kHz) and a photocuring sensitivity of 100 $mJ/cm^2$ each in a targeted range. Also, a cross-cut test was performed on the optical gap layer to evaluate the adhesiveness. As a result, the optical gap layer has an excellent adhesive force of 5 B as well as an excellent remaining film ratio of 95%. Also, with the optical gap layer according to an exemplary embodiment of the present disclosure, the touch sensitivity is 43 dB, which confirms that the touch sensing performance is excellently improved.

As a result of this, it may be seen that if the optical gap layer including the sub-lens layer and the cylindrical structure layer is embedded in the touch sensor unit according to the present disclosure, it is possible to simultaneously improve the front luminance and the viewing angle control efficiency which have a trade-off relationship.

The exemplary embodiments of the present disclosure can also be described as follows:

According to an aspect of the present disclosure, a display device comprises a substrate, a plurality of light emitting diodes (LEDs) disposed on the substrate, an encapsulation layer disposed to cover the plurality of LEDs, a touch sensor unit disposed on the encapsulation layer, and a lens layer disposed on the touch sensor unit, wherein the touch sensor unit includes a plurality of bridge electrodes disposed on the encapsulation layer, an optical gap layer disposed on the bridge electrodes to expose at least a part of each of the plurality of bridge electrodes, and a touch electrode disposed to be in contact with each of the plurality of exposed bridge electrodes, and the optical gap layer includes a sub-lens layer disposed corresponding to the plurality of LEDs, a cylindrical structure layer disposed on the sub-lens layer to correspond to the plurality of LEDs, and an overcoating layer that covers the sub-lens layer and the cylindrical structure layer to planarize an upper surface.

A plurality of sub-pixels may be defined on the substrate, and each of the plurality of sub-pixels may include a first LED and a second LED disposed on the substrate, and the lens layer may include a first lens that refracts light from the first LED and a second lens that refracts light from the second LED.

The display device may further comprise a bank disposed on the substrate to correspond between the sub-pixels adjacent to each other and between the first LED and the second LED, wherein the plurality of bridge electrodes and the touch electrode may be disposed corresponding to the bank, and the first lens may be disposed to overlap the first LED, and the second lens may be disposed to overlap the second LED.

The first lens may be a half-spherical lens and the second lens may be a half-cylindrical lens.

The sub-lens layer may include a plurality of sub-lenses disposed to overlap each of the first LED and the second LED, and the cylindrical structure layer may include a plurality of cylindrical structures disposed to overlap each of the first LED and the second LED.

The plurality of cylindrical structures may be disposed to be in contact with respective upper portions of the plurality of sub-lenses.

Each of the plurality of cylindrical structures may be disposed to be perpendicular to a lower surface of the sub-lens layer.

At least one cylindrical structure may be disposed on a sub-lens to be perpendicular to the lower surface of the sub-lens layer.

The plurality of cylindrical structures may be laminated as a plurality of layers on the sub-lens layer.

The number of sub-lenses overlapping the first LED may be greater than the number of first lenses overlapping the first LED, and the number of sub-lenses overlapping the second LED may be greater than the number of second lenses overlapping the second LED.

Each of the plurality of sub-lenses may be any one selected from a half-spherical lens and a half-cylindrical lens.

The sub-lens layer may contain a transparent resin and nanoparticles, and the plurality of cylindrical structures may be configured as a vertical alignment filler, and the vertical alignment filler may be selected from carbon nanotubes, silicon-based nanotubes and acrylic nanotubes.

The transparent resin may be one or more selected from acrylic resin, siloxane-based resin, polyimide-based resin, polyamide-based resin, cycloolefin-based resin and fluorine-based resin.

The nanoparticles may be one or more selected from fullerene, silica, zirconium oxide ($ZrO_2$) and titanium dioxide ($TiO_2$).

A radius of each of the plurality of cylindrical structures may be smaller than a radius of each of the plurality of sub-lenses.

The optical gap layer may have a thickness of 2 μm to 20 μm, the sub-lens layer may have a thickness of 5 μm or less, and the cylindrical structure layer may have a thickness of 1 μm or more.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
a substrate;
a plurality of light emitting diodes (LEDs) on the substrate;
an encapsulation layer on the plurality of LEDs;
a touch sensor unit on the encapsulation layer; and
a lens layer on the touch sensor unit,
wherein the touch sensor unit includes:
a plurality of bridge electrodes on the encapsulation layer;
an optical gap layer on the bridge electrodes to expose at least a part of each of the plurality of bridge electrodes; and
a touch electrode in contact with each of the plurality of exposed bridge electrodes, and
the optical gap layer includes:
a sub-lens layer disposed corresponding to the plurality of LEDs;
a cylindrical structure layer on the sub-lens layer to correspond to the plurality of LEDs; and
an overcoating layer on the sub-lens layer and the cylindrical structure layer,
wherein a plurality of sub-pixels is defined on the substrate,
wherein each of the plurality of sub-pixels includes a first LED and a second LED on the substrate, and
wherein the lens layer includes a first lens that refracts light from the first LED and a second lens that refracts light from the second LED.

2. The display device according to claim 1, further comprising:
a bank on the substrate to correspond between the sub-pixels adjacent to each other and between the first LED and the second LED,
wherein the plurality of bridge electrodes and the touch electrode are disposed corresponding to the bank, and
wherein the first lens is disposed to overlap the first LED, and the second lens is disposed to overlap the second LED.

3. The display device according to claim 2, wherein the first lens includes a half-spherical lens and the second lens includes a half-cylindrical lens.

4. The display device according to claim 2, wherein the sub-lens layer includes a plurality of sub-lenses that overlaps each of the first LED and the second LED, and
wherein the cylindrical structure layer includes a plurality of cylindrical structures that overlaps each of the first LED and the second LED.

5. The display device according to claim 4, wherein the plurality of cylindrical structures is in contact with respective upper portions of the plurality of sub-lenses.

6. The display device according to claim 5, wherein at least one cylindrical structure is on a sub-lens to be perpendicular to the lower surface of the sub-lens layer.

7. The display device according to claim 5, wherein the plurality of cylindrical structures is laminated as a plurality of layers on the sub-lens layer.

8. The display device according to claim 4, wherein the number of sub-lenses overlapping the first LED is greater than the number of first lenses overlapping the first LED, and
wherein the number of sub-lenses overlapping the second LED is greater than the number of second lenses overlapping the second LED.

9. The display device according to claim 1, wherein the sub-lens layer contains a transparent resin and nanoparticles,
wherein the plurality of cylindrical structures is configured as a vertical alignment filler, and
wherein the vertical alignment filler is selected from carbon nanotubes, silicon-based nanotubes, and acrylic nanotubes.

10. The display device according to claim 9, wherein the transparent resin is one or more selected from acrylic resin, siloxane-based resin, polyimide-based resin, polyamide-based resin, cycloolefin-based resin, and fluorine-based resin.

11. The display device according to claim 9, wherein the nanoparticles are one or more selected from fullerene, silica, zirconium oxide ($ZrO_2$) and titanium dioxide ($TiO_2$).

12. The display device according to claim 4, wherein a radius of each of the plurality of cylindrical structures is smaller than a radius of each of the plurality of sub-lenses.

13. A display device, comprising:
a first emission area on a substrate;
a first light emitting diode disposed to overlap the first emission area;
an optical gap layer on the first light emitting diode and
a lens layer on the optical gap layer,
wherein the optical gap layer includes:
a plurality of sub-lenses that overlaps the first light emitting diode;
a plurality of light guiding structures between the lens layer and the plurality of sub-lenses; and
an overcoating layer that covers the plurality of sub-lenses and the plurality of light guiding structures,
wherein the lens layer including a first lens that overlaps the plurality of sub-lenses,
wherein respective light guiding structure includes a cylindrical structure,
wherein the overcoating layer is disposed to fill spaces between the plurality of sub-lenses and the plurality of light guiding structures such that the plurality of sub-lenses and the plurality of light guiding structures are encapsulated within the overcoating layer.

14. The display device of claim 13,
wherein the plurality of light guiding structures overlaps with the first lens.

15. The display device of claim 14, wherein respective sub-lens includes a half-spherical shape.

16. The display device of claim 14, comprising:
a touch electrode on the optical gap layer,
wherein the touch electrode exposes a top surface of the optical gap layer,
wherein the top surface of the optical gap layer that is exposed by the touch electrode overlaps the first lens of the lens layer,
and wherein a top surface of the overcoating layer contacts the touch electrode.

17. The display device of claim 14, comprising:

a second emission area adjacent to the first emission area; and a second light emitting diode overlapping the second emission area;

wherein the optical gap layer includes:

a plurality of second sub-lenses that overlaps the second light emitting diode; and a plurality of second light guiding structures on the plurality of second sub-lenses, wherein the lens layer includes a second lens that overlaps the plurality of second sub-lenses and the plurality of second light guiding structures, and wherein the second lens includes a half-cylindrical lens that has a different viewing angle from the first lens including a half-spherical lens.

18. The display device of claim 17, wherein respective second light guiding structure includes a cylindrical structure and respective second sub-lens includes a half-spherical shape.

19. The display device of claim 14, wherein the optical gap layer includes:

a plurality of second light guiding structures on the plurality of light guiding structures;

wherein a number of the plurality of second light guiding structures is different from a number of the plurality of light guiding structures.

20. The display device of claim 14, wherein each of the plurality of light guiding structures is respectively on the sub-lenses.

* * * * *